United States Patent
Schaltz et al.

(10) Patent No.: US 10,021,811 B2
(45) Date of Patent: Jul. 10, 2018

(54) SINGLE ENDED COOLING MODULE ROWS AND ASSEMBLIES FOR THERMAL MANAGEMENT OF IN-LINE MEMORY MODULES

(71) Applicant: Asetek Danmark A/S, Aalborg East (DK)

(72) Inventors: Torben Søgaard Schaltz, Hobro (DK); Jan Hunskjær, Svenstrup (DK); Kim Henriksen, Tylstrup (DK)

(73) Assignee: Asetek Danmark A/S, Aalborg East (DK)

( * ) Notice: Subject to any disclaimer, the term of this patent is extended or adjusted under 35 U.S.C. 154(b) by 0 days.

(21) Appl. No.: 15/163,122

(22) Filed: May 24, 2016

(65) Prior Publication Data

US 2017/0347486 A1 Nov. 30, 2017

(51) Int. Cl.
*H05K 7/20* (2006.01)
*G06F 1/20* (2006.01)

(52) U.S. Cl.
CPC .......... *H05K 7/20272* (2013.01); *G06F 1/20* (2013.01); *H05K 7/20254* (2013.01); *H05K 7/20772* (2013.01)

(58) Field of Classification Search
CPC .. H05K 7/20272; G06F 1/20; G06F 2200/201
See application file for complete search history.

(56) References Cited

U.S. PATENT DOCUMENTS

| | | | |
|---|---|---|---|
| 3,524,497 A | 8/1970 | Chu et al. | |
| 5,740,018 A * | 4/1998 | Rumbut, Jr. | ....... H05K 7/20563 165/46 |
| 6,421,240 B1 | 7/2002 | Patel | |
| 6,496,375 B2 | 12/2002 | Patel et al. | |
| 6,655,449 B1 | 12/2003 | Hsien | |
| 6,667,882 B2 | 12/2003 | Pauser | |
| 6,853,554 B2 | 2/2005 | Cullen | |

(Continued)

FOREIGN PATENT DOCUMENTS

WO    WO 2011/053307 A1    5/2011

OTHER PUBLICATIONS

PCT International Search Report & PCT Written Opinion of the International Searching Authority for PCT Application No. PCT/IB2013/002453, dated Feb. 6, 2014, (11 pages).

(Continued)

*Primary Examiner* — Robert J Hoffberg
*Assistant Examiner* — Matt Dhillon
(74) *Attorney, Agent, or Firm* — Finnegan, Henderson, Farabow, Garrett & Dunner LLP

(57) ABSTRACT

A cooling module row for an inline-memory module is provided. The cooling module row may include an inlet chamber and an outlet chamber positioned at a same end of the cooling module row. The cooling module row may also include a conduit in fluid communication with the inlet chamber and the outlet chamber. The conduit may be sized to fit adjacent the in-line memory module. A method of heat management for an in-line memory module is also provided. The method may include positioning a cooling module row adjacent the in-line memory module, the cooling module row having an inlet chamber and an outlet chamber positioned at the same end of the cooling module row.

20 Claims, 11 Drawing Sheets

(56) References Cited

U.S. PATENT DOCUMENTS

| | | |
|---|---|---|
| 7,151,668 B1 | 12/2006 | Stathakis |
| D553,170 S | 10/2007 | Remsburg et al. |
| 7,286,355 B2 | 10/2007 | Cheon |
| 7,312,987 B1 * | 12/2007 | Konshak ............ G06F 1/20 165/80.4 |
| D561,711 S | 2/2008 | Pei-Hsi Line et al. |
| D573,110 S | 7/2008 | Otsuki et al. |
| 7,855,888 B2 | 12/2010 | Peterson |
| 7,907,398 B2 | 3/2011 | Hrehor, Jr. et al. |
| 7,933,125 B2 | 4/2011 | Wei et al. |
| 7,957,134 B2 | 6/2011 | Farnsworth et al. |
| 7,965,509 B2 * | 6/2011 | Campbell ............ H01L 23/473 165/104.33 |
| 7,969,736 B1 * | 6/2011 | Iyengar ............ H01L 23/36 165/104.33 |
| 8,004,841 B2 | 8/2011 | Cipolla et al. |
| 8,027,162 B2 | 9/2011 | Campbell et al. |
| 8,066,057 B2 | 11/2011 | Olesen |
| 8,081,473 B2 | 12/2011 | Cipolla et al. |
| 8,125,780 B2 | 2/2012 | Goth et al. |
| 8,238,101 B2 | 8/2012 | Kalms et al. |
| 8,385,067 B2 | 2/2013 | Arvelo et al. |
| 8,385,069 B2 | 2/2013 | Iyengar et al. |
| 8,493,738 B2 * | 7/2013 | Chainer ............ H05K 7/20772 361/679.53 |
| 8,570,744 B2 | 10/2013 | Rau et al. |
| 8,587,943 B2 | 11/2013 | Barina et al. |
| 8,599,557 B2 | 12/2013 | Peterson et al. |
| 8,638,559 B2 | 1/2014 | Barina et al. |
| 8,649,177 B2 | 2/2014 | Chainer et al. |
| 8,659,897 B2 | 2/2014 | Meijer et al. |
| D715,747 S | 10/2014 | Imoto |
| D715,750 S | 10/2014 | Mira et al. |
| 8,913,384 B2 * | 12/2014 | David ............ H05K 13/00 361/679.53 |
| 9,158,348 B2 | 10/2015 | Berk et al. |
| D755,741 S | 5/2016 | Prajuckamol et al. |
| 9,341,418 B2 * | 5/2016 | Arvelo ............ F28F 1/00 |
| D772,823 S | 11/2016 | Lindeman |
| D773,408 S | 12/2016 | Lindeman |
| D774,473 S | 12/2016 | Lindeman |
| D800,674 S * | 10/2017 | Schaltz ............ D13/179 |
| D800,675 S * | 10/2017 | Schaltz ............ D13/179 |
| 2004/0182544 A1 | 9/2004 | Lee et al. |
| 2005/0117298 A1 | 6/2005 | Koga et al. |
| 2006/0007720 A1 | 1/2006 | Pfeifer et al. |
| 2006/0098409 A1 | 5/2006 | Cheon |
| 2006/0250772 A1 | 11/2006 | Salmonson et al. |
| 2006/0291165 A1 * | 12/2006 | Flesch ............ H01L 23/473 361/699 |
| 2008/0007915 A1 | 1/2008 | Chen |
| 2008/0084664 A1 | 4/2008 | Campbell et al. |
| 2008/0264613 A1 * | 10/2008 | Chu ............ H01L 23/4093 165/104.33 |
| 2009/0002951 A1 | 1/2009 | Legen et al. |
| 2009/0044929 A1 | 2/2009 | Yun-Yu Yeh et al. |
| 2009/0080151 A1 | 3/2009 | Kalms et al. |
| 2009/0190303 A1 * | 7/2009 | Chu ............ G06F 1/20 361/679.47 |
| 2009/0268409 A1 | 10/2009 | Zhou et al. |
| 2009/0277616 A1 | 11/2009 | Cipolla et al. |
| 2009/0284924 A1 * | 11/2009 | Konshak ............ H05K 7/20672 361/700 |
| 2009/0323286 A1 | 12/2009 | Han |
| 2010/0025010 A1 * | 2/2010 | Cipolla ............ H01L 23/4093 165/47 |
| 2010/0085712 A1 | 4/2010 | Hrehor, Jr. et al. |
| 2010/0091447 A1 | 4/2010 | Jaggers et al. |
| 2010/0175852 A1 | 7/2010 | Peterson |
| 2010/0252234 A1 * | 10/2010 | Cambell ............ H01L 23/473 165/80.2 |
| 2011/0069454 A1 | 3/2011 | Campbell et al. |
| 2011/0304979 A1 | 12/2011 | Peterson et al. |
| 2012/0020004 A1 * | 1/2012 | Rau ............ G06F 1/20 361/679.31 |
| 2012/0020022 A1 | 1/2012 | Peterson et al. |
| 2012/0152500 A1 | 6/2012 | Kao et al. |
| 2012/0261095 A1 | 10/2012 | Wu |
| 2013/0027870 A1 | 1/2013 | Gottfried Goldrian et al. |
| 2013/0120926 A1 * | 5/2013 | Barina ............ H01L 23/4093 361/679.32 |
| 2013/0135812 A1 | 5/2013 | Barina et al. |
| 2013/0194745 A1 | 8/2013 | Meijer et al. |
| 2013/0342987 A1 | 12/2013 | Yang et al. |
| 2014/0002980 A1 * | 1/2014 | Berk ............ G06F 1/20 361/679.31 |
| 2014/0069614 A1 | 3/2014 | Chiu |
| 2015/0053388 A1 * | 2/2015 | Arvelo ............ F28F 1/12 165/181 |
| 2015/0212555 A1 * | 7/2015 | Cox ............ H01L 23/427 361/679.52 |
| 2016/0026223 A1 | 1/2016 | Berk et al. |
| 2016/0118317 A1 | 4/2016 | Shedd et al. |
| 2016/0234968 A1 | 8/2016 | Huang |
| 2016/0327996 A1 | 11/2016 | Sasabe |
| 2016/0363967 A1 | 12/2016 | Tsai |
| 2016/0366788 A1 | 12/2016 | Liao et al. |

OTHER PUBLICATIONS

International Search Report for International Application No. PCT/IB2017/000644 dated Aug. 8, 2017 (3 pages).

Written Opinion of the International Searching Authority for International Application No. PCT/IB2017/000644 dated Aug. 8, 2017 (8 pages).

* cited by examiner

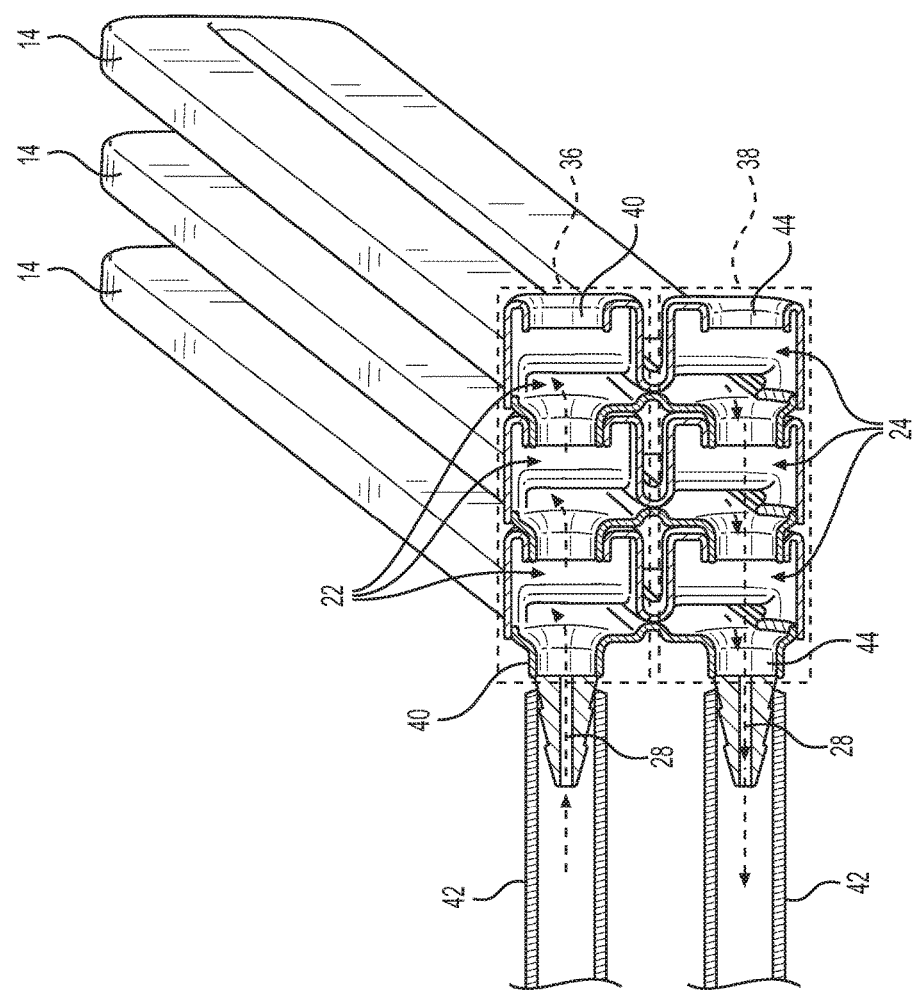

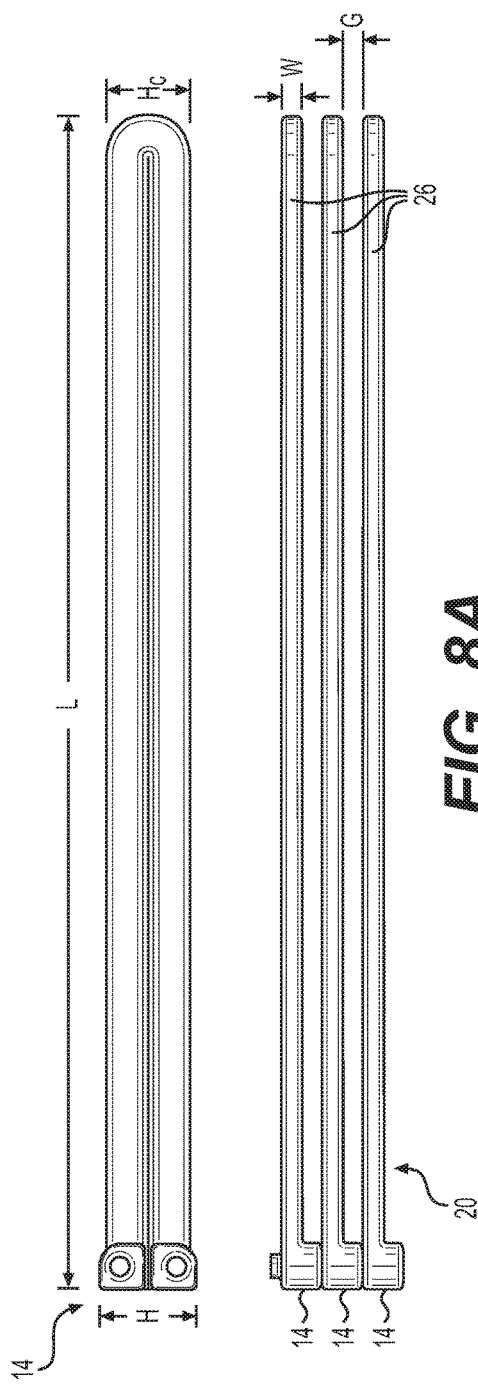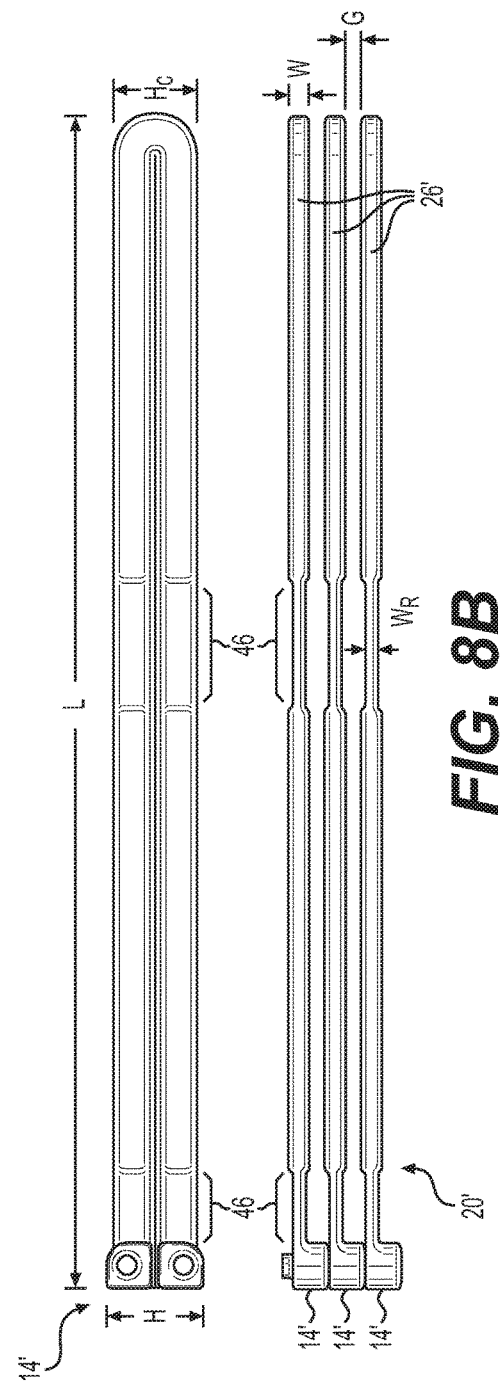

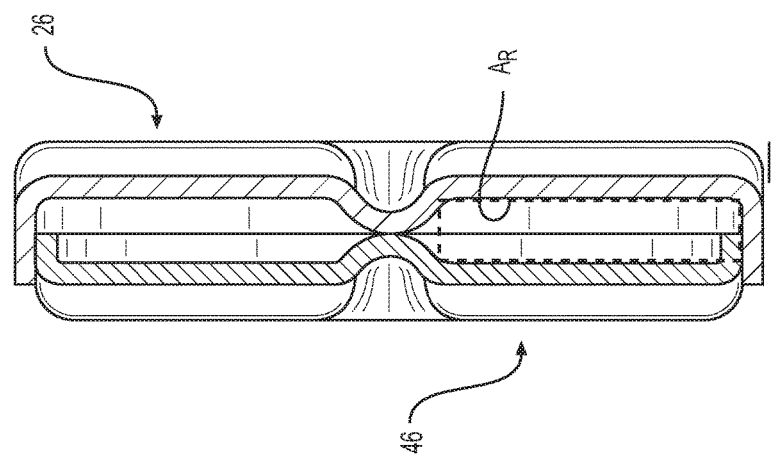
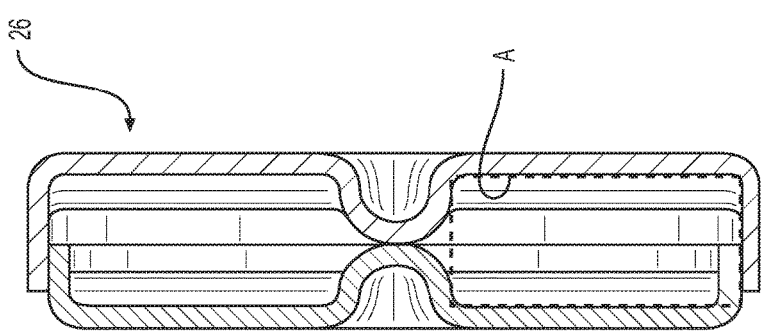

SINGLE ENDED COOLING MODULE ROWS AND ASSEMBLIES FOR THERMAL MANAGEMENT OF IN-LINE MEMORY MODULES

BACKGROUND

Technical Field

The present disclosure relates generally to the field of liquid cooling systems for cooling heat-generating components of a computer, server or other data processing devices and systems, and more particularly, single ended cooling module rows and assemblies for thermal management of in-line memory modules.

Background Description

Electronic systems, such as, for example, computer systems include several integrated circuit (IC) devices that generate heat during operation. For effective operation of the computer system, the temperature of the IC devices has to be maintained within acceptable limits. While the problem of heat removal from IC devices is an old one, this problem has increased in recent years due to greater numbers of transistors that are packed into a single IC device while reducing the physical size of the device. Increasing the number of transistors compacted into a smaller area results in a greater concentration of heat that must be removed from that smaller area. Bundling multiple computer systems together, such as, for example, in a server, further exacerbates the heat removal problem by increasing the amount of heat that has to be removed from a relatively small area.

One known component of a computer system which includes IC devices is an in-line memory module (IMM). These IMMs come in various configurations, such as single in-line memory modules (SIMMs) or dual in-line memory modules (DIMMs), such as synchronous dynamic random access memory (SDRAM) DIMMs or double data rate (DDR) SDRAM DIMMs, Through Silicon Via (TSV) memory modules, or multi-die dynamic memory (DRAM) packaged memory modules. In-line memory modules include a series of ICs mounted on a printed circuit board, connected to other electrical components. The printed circuit board usually plugs into another printed circuit board, such as a motherboard, and transmits data to a processor. IMMs come in different heights. One of the standard heights of IMMs is "Low Profile" (LP) which measures about 30 mm. Another standard height is "Very Low Profile" (VLP) which measures about 18.75 mm. Both the LP and the VLP IMMs have the same width and pinout, allowing substitution of one with the other, overhead space permitting.

In contrast, there are no standards for the space surrounding IMMs in a computer system. The space between one IMM and another, the location of a IMM, the latches to keep the IMM secured, and the connector with which the IMM plugs into the motherboard, all have variable dimensions, from computer system to computer system. Often IMMs are located close to a processor which itself generates a significant amount of heat. If an IMM becomes too warm, for example above a defined threshold, such as 85 degrees Celsius, data bits are at a higher risk of corruption. Such thresholds can vary according to the specific IMM or other electronics part or module at issue.

Prior art cooling systems are predominantly air-cooling systems with fans. These systems require relatively large amounts of space and prevent compactness in overall device or system design. Disadvantageously, air-cooling systems generate a great deal of noise, are energy inefficient, and are susceptible to mechanical failures. In addition, the density of components in current systems obstructs the flow of air, reducing the heat-removing efficacy of such cooling systems.

More recently, liquid cooling systems have been developed. Although these systems have provided improved cooling capability, there is much room for significant advancement in the designs in order to render them more versatile and universally compatible. For example, often there is limited physical space at both ends of IMMs for inlet and outlet fluid connectors, particularly when retrofitting a computer system or server with a new liquid cooling system.

SUMMARY

The present disclosure is directed to cooling module rows for in-line memory modules and corresponding methods of cooling.

In one aspect, the present disclosure is directed to a cooling module row for an inline-memory module. The cooling module row may include an inlet chamber and an outlet chamber positioned at a same end of the cooling module row. The cooling module row may also include a conduit in fluid communication with the inlet chamber and the outlet chamber. The conduit may be sized to fit adjacent the in-line memory module.

In another aspect, the present disclosure is directed to a cooling module row assembly for in-line memory modules. The cooling module row assembly may include a plurality of cooling module rows. Each cooling module row may include an inlet chamber an outlet chamber positioned at a same end of the cooling module row. Each cooling module row may also include a conduit in fluid communication with the inlet chamber and the outlet chamber. The plurality of cooling module rows may be sized to fit adjacent the in-line memory modules.

In another aspect, the present disclosure is directed to a method of heat management for an in-line memory module. The method may include positioning a cooling module row adjacent the in-line memory module, the cooling module row having an inlet chamber and an outlet chamber positioned at the same end of the cooling module row. The method may also include supplying a coolant fluid to the inlet chamber and directing the coolant fluid from the inlet chamber through a conduit that extends down and back along a length of the inline-memory module so the coolant fluid can absorb heat from the in-line memory module. The method may further include receiving the coolant fluid from the conduit in the outlet chamber and directing it out of the outlet chamber to discharge the heat.

BRIEF DESCRIPTION OF DRAWINGS

FIG. 6 is a cross-sectional view of the cooling module row assembly of FIG. 2.

FIG. 8A shows a front view and top view of the cooling module row assembly of FIG. 2.

FIG. 8B shows a front view and top of another exemplary embodiment of a cooling module row assembly.

FIG. 9A is a cross-sectional view of the cooling module row of FIG. 3.

FIG. 9B is a cross-sectional view of a cooling module row of FIG. 8B at a recessed section.

DETAILED DESCRIPTION

Reference will now be made in detail to embodiments of the present disclosure, examples of which are illustrated in the accompanying drawings. Where possible, the same reference numbers will be used throughout the drawings to refer to the same or like parts.

Figure 1:
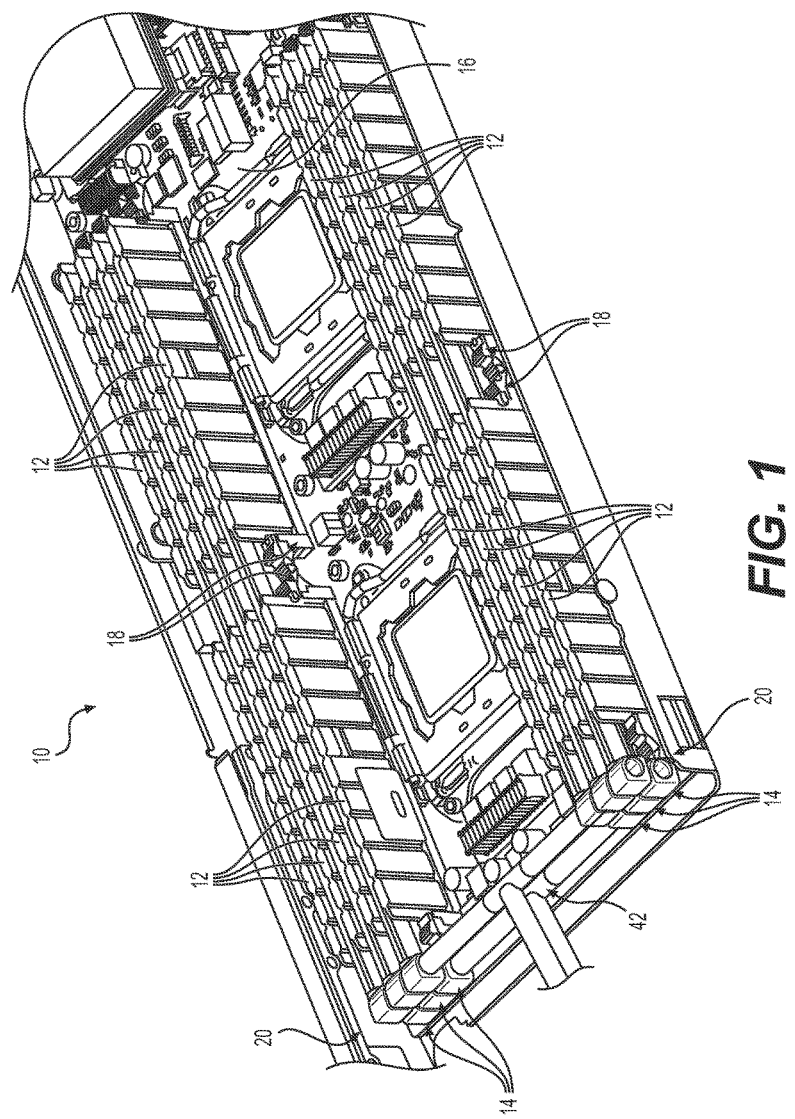
FIG. 1 is a perspective view of a portion of a computer server with cooling module row assemblies positioned within, according to an exemplary embodiment.

FIG. 1 shows a perspective view of a portion of a computer server 10. Computer server 10 shown in FIG. 1 is an illustrative example and is not intended to limit the disclosure. It is contemplated that the present disclosure is equally applicable to other computers and computer servers having other components and/or arrangements.

As shown in FIG. 1, computer server 10 may include a plurality of in-line memory modules (IMMs) 12. Positioned between the plurality of IMMs 12 as shown in FIG. 1 may be a plurality of cooling module rows 14, which may be part of a thermal management system. The thermal management system including the cooling module rows 14 may be designed to regulate (e.g., cool) the temperature of the IMMs 12. IMMs 12 may be any type of in-line memory modules, for example, single in-line memory modules (SIMMs), dual in-line memory modules (DIMMs), or Rambus in-line memory modules (RIMMs).

IMMs 12 illustrated in FIG. 1 are shown as DIMMs, but they may be any type of in-line memory modules. In some embodiments, IMMs 12 may be Low Profile (LP) IMMs with a height of about 30 mm. In other embodiments, IMMs 12 may be Very Low Profile (VLP) IMMs with a height of about 18.75 mm. It is contemplated that other dimensions, standard or otherwise, are envisioned. In some embodiments, as shown in FIG. 1, computer server 10 may include a printed circuit board 16 and a plurality of in-line memory sockets 18 capable of receiving and securing IMMs 12.

The thermal management system may include one or more cooling module rows 14 that may be positioned adjacent and/or between IMMs 12, as shown in FIG. 1.

Figure 2:
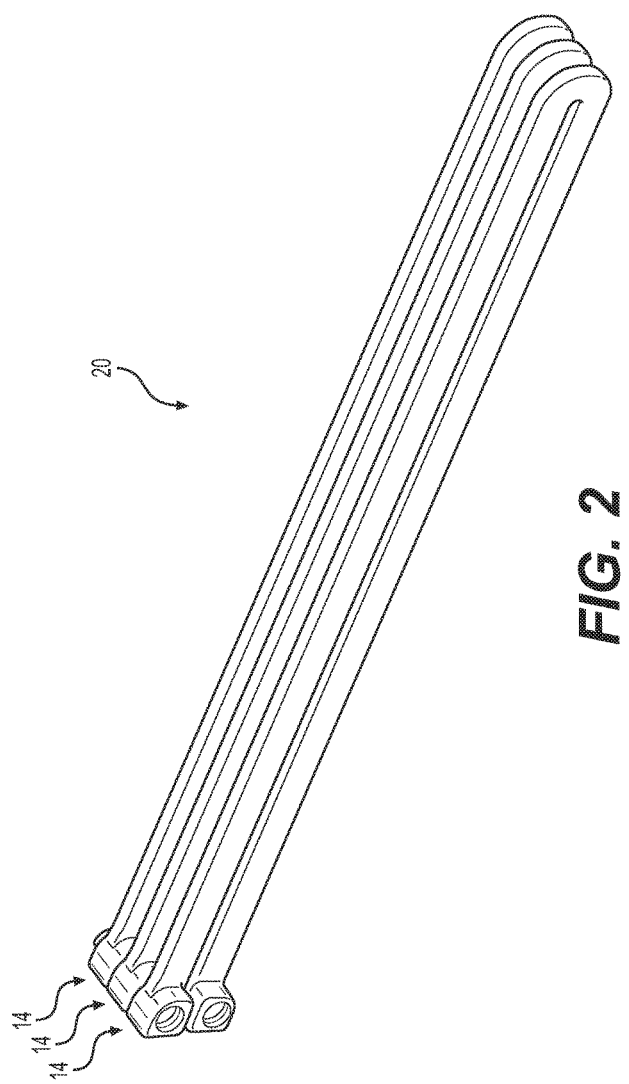
FIG. 2 shows a perspective view of a cooling module row assembly, according to exemplary embodiments.

FIG. 2 shows one embodiment of a cooling module row assembly 20 that is made up of three cooling module rows 14. Other cooling module row assemblies 20 may be made up of more or less than three cooling module rows 14. For example, cooling module row assembly 20 may include two, four, five, six, seven, eight, or more cooling module rows 14.

Figure 3:
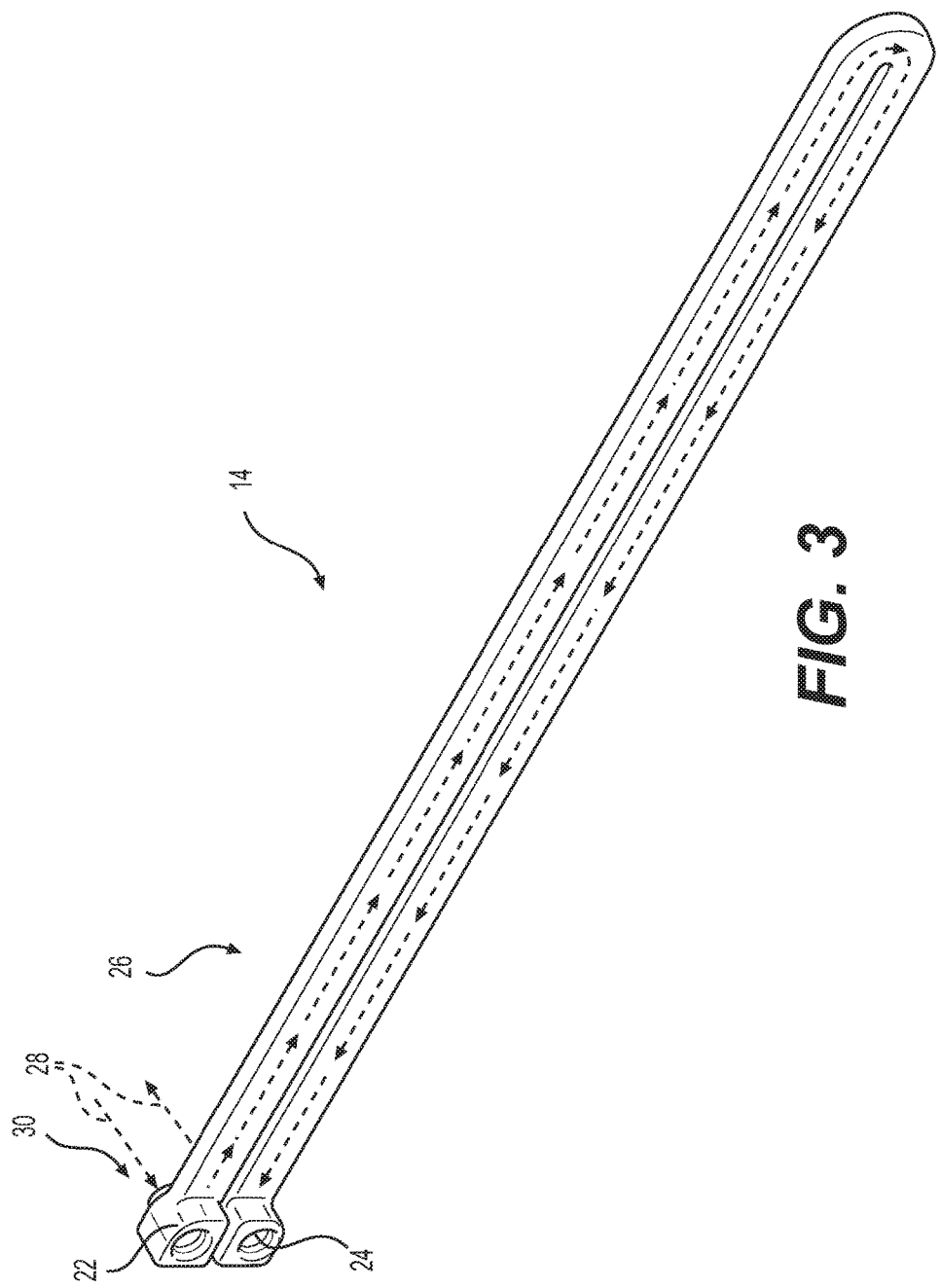
FIG. 3 is a perspective view of a cooling module row, according to an exemplary embodiment.

FIG. 3 shows an exemplary embodiment of an individual cooling module row 14. An individual module row 14 may include an inlet chamber 22, an outlet chamber 24, and a conduit 26 in fluid communication with inlet chamber 22 and outlet chamber 24. Inlet chamber 22 may be configured to receive a coolant fluid 28 and direct it to conduit 26. Outlet chamber 22 may be configured to receive the coolant fluid from conduit 26 and direct it out of outlet chamber 22.

As shown in FIG. 3, inlet chamber 22 and outlet chamber 24 may be position on the same end (e.g., a first end 28) of cooling module row 14. In some embodiments, as shown in FIG. 3, inlet chamber 22 and outlet chamber 24 may be stacked on top of one another. The illustrative embodiment shown in FIG. 3, shows inlet chamber 22 stacked on top of outlet chamber 24, but in other embodiments outlet chamber 24 may be stacked on top of inlet chamber 22. Merely changing the flow direction of coolant fluid 28 to and from cooling module row 14 can effectively swap the function of each chamber.

In some embodiments, inlet chamber 22 and outlet chamber 24 may be structurally connected, but not fluidly connected beside through conduit 26. In other embodiments, inlet chamber 22 and outlet chamber 24 may be neither structurally connected nor fluidly connected besides through conduit 26.

Conduit 26 may be configured to extend along at least a portion of a length of an IMMs 12. In some embodiments, conduit 26 may be U-shaped so that coolant fluid 28 may flow out of inlet chamber 22 down conduit 26 along an IMMs 12 and then do a 180 degree turn and flow back down conduit 26 along the same IMMs 12 to outlet chamber 24. In some embodiments, U-shaped conduit 26 may have a vertical orientation as shown in FIG. 3, such that a first half of conduit 26 is positioned above or below a second half of conduit 26.

It is contemplated that in other embodiments, U-shaped conduit 26 may have a horizontal orientation such that a first half of conduit 26 is positioned next to a second half of conduit 26. In some embodiments where U-shaped conduit 26 has a horizontal orientation, the first half of conduit 26 and the second half of conduit 26 may be spaced apart so they define a cavity in between. The cavity may be sized to receive an IMM 12 such that a cooling module row may have an inlet and outlet chamber at one end of an IMM 12 and conduit 26 may extend around a perimeter of the IMM 12.

Cooling module row 14 may be manufactured from a variety of materials utilizing a variety of methods. For example, in some embodiments, cooling module row 14 may be manufactured from metals, plastics, composites, or other suitable materials. In some embodiments, cooling module row 14 may be manufactured from copper, aluminum, or other like metals. In some embodiments, cooling module row 14 may be manufactured by plastics suitable for vacuum forming. Some methods of manufacturing cooling module row 14 may include vacuum forming, blow molding, rotational molding, or other suitable methods.

Figure 4:
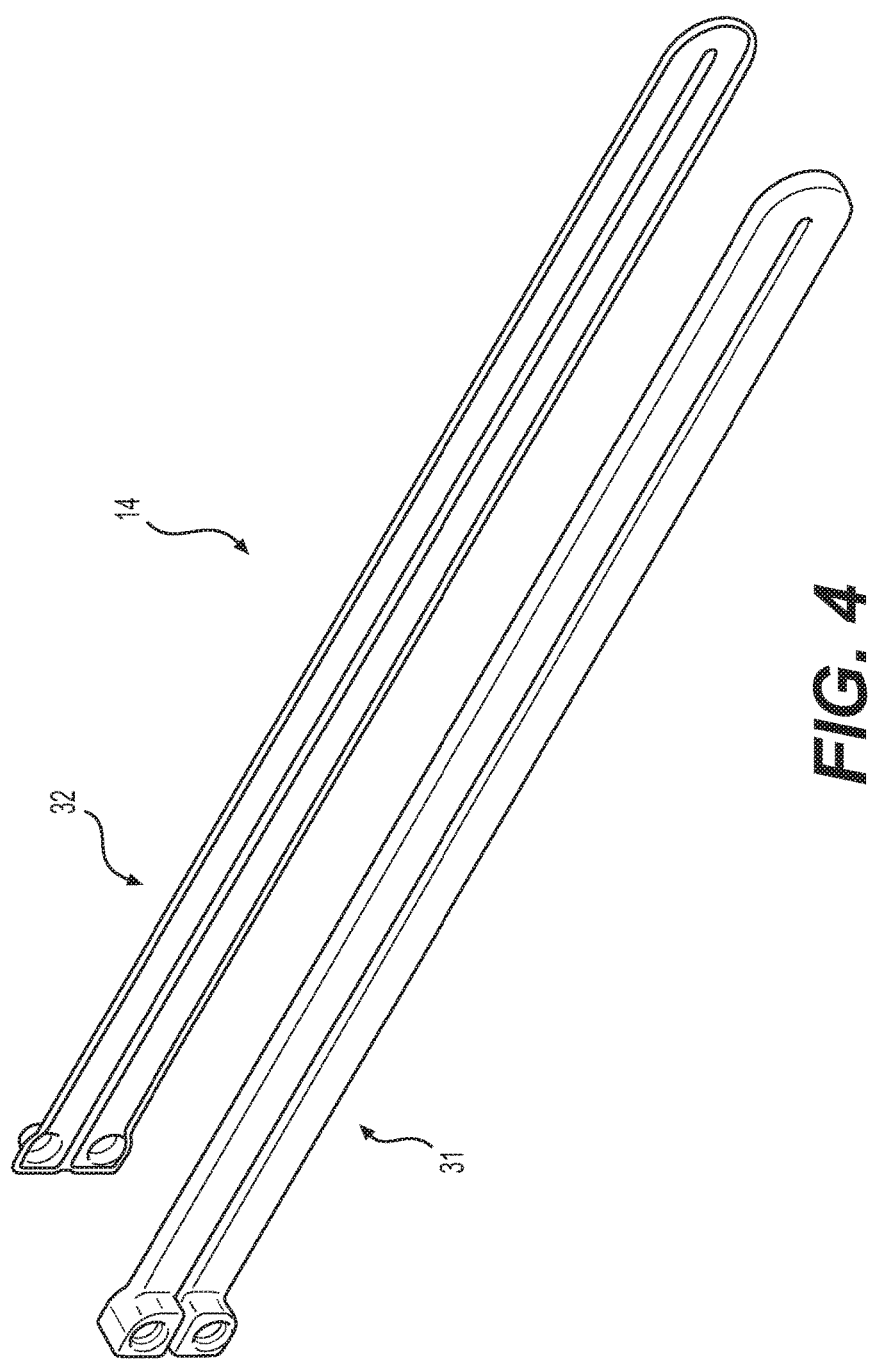
FIG. 4 is a perspective view of an exploded assembly of the cooling module row of FIG. 3.

In some embodiments, cooling module row 14 may be formed of one or more components. For example, as shown in FIG. 4, cooling module row 14 may be formed of a first component 31 and a second component 32, according to an exemplary embodiment. In some embodiments, first component 31 and second component 32 may be metal and manufactured by a stamping and/or punching process and the first and second components 31/32 may be joined by brazing. Alternative methods of joining first component 31 and second component 32 may include, for example, welding (e.g., ultrasonic), adhesive bonding, or other like methods. It is contemplated that in some embodiments, first component 31 and second component 32 may be manufactured by injection molding or die casting. In some embodiments, module row 14 may be manufactured as a single injected or cast component.

Figure 5:
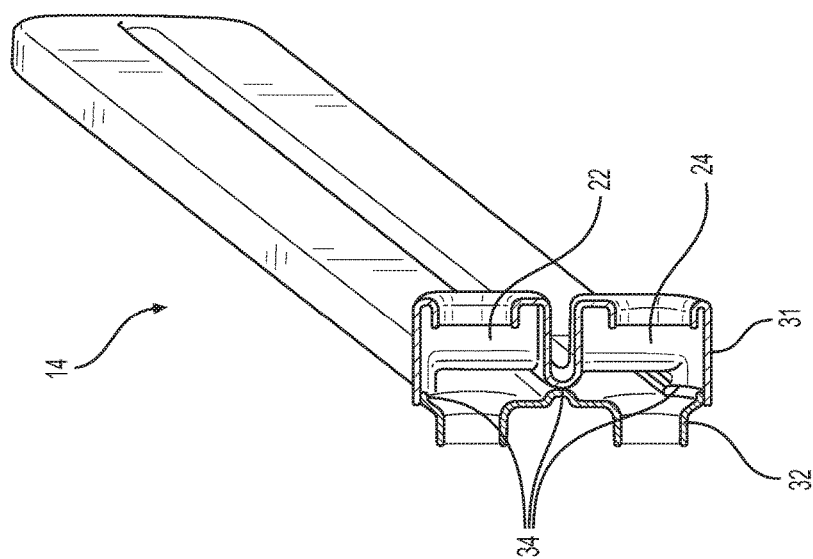
FIG. 5 is a cross-sectional view of the cooling module row of FIG. 3.

FIG. 5 shows a cross-sectional view of an individual cooling module row 14 illustrating how first component 31 and second component 32 may be joined and shows a portion a plurality of seams 34 where first component 31 and second component 32 may be brazed, welded, or otherwise attached.

Cooling module row 14 may have a modular design that enable a plurality of cooling module rows 14 be combined to form a cooling module row assembly 20, as shown in FIGS. 1, 2, and 6. As shown in FIG. 6, a plurality of module rows 14 may be combined to form a module row assembly 20. In some embodiments the plurality of cooling module rows 14 may be fixedly coupled together by brazing, welding, adhesive bonding, or some other suitable method. In some embodiments, the plurality of cooling module rows 14 may be designed to be releasably coupled. For example, the plurality of housing rows 14 may be designed for snap or push fit connection that may use one or more seals for sealing the connections between the plurality of cooling module rows 14.

As shown in FIG. 6, module row assembly 20 may have an inlet header 36 and outlet header 38. Inlet header 36 may be formed by the combination of the plurality of inlet chambers 22 and an outlet header 38 may be formed by the combination of the plurality of outlet chambers 24. Inlet header 36 may have one or more inlet ports 40 configured to receive coolant fluid 28 supplied by one or more tubes 42 or other suitable fluid conduits. Outlet header 38 may have one or more outlet ports 44 configured to deliver the coolant fluid to one or more tubes 42. Tubes 42 may be flexible, rigid, or semi-rigid. Inlet ports 40 or outlet ports 44 not in use may be blanked off using a blank or plug.

As shown in FIG. 1, the thermal management system may include tubes 42 that interconnect the cooling module row assemblies 20. Tubes 42 may carry cooling liquid to and from the one or more cooling module row assemblies 20 forming a coolant fluid loop that carries away heat from the IMMs 12 positioned adjacent to coolant module row assemblies 20. Coolant fluid 28 may be carried external to computer server 10 where the heat may be discharged and coolant fluid 28 may then be recirculated back to computer server 10 to remove more heat from IMMs 14. In some embodiments, coolant fluid 28 may be water although, in other embodiments, it is obvious that other liquids could be used as coolant fluid 28. In some embodiments, tubes 42 may be connected to other cooling devices (not shown) of the thermal management system associated with other heat generating components of computer server 10. For example, tubes 42 may be connected to one or more cold plates associated with one or more processors that are designed to transfer heat away from the processor(s).

As shown in FIG. 6, inlet ports 40 and outlet ports 44 may be configured to connect to tubes 42 using a variety of connector types, including for example, hose barb connectors, snap or push fit connectors, threaded connector, or other suitable connectors.

Figure 7A:
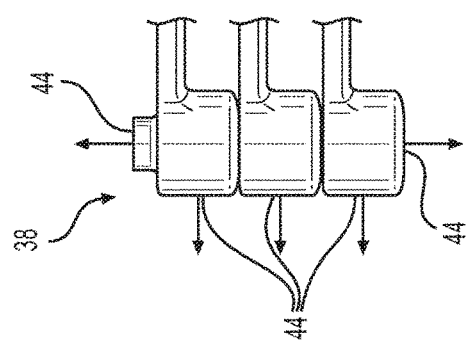
FIG. 7A is a top view of a portion of the cooling module row assembly of FIG. 2, showing an inlet header.
Figure 7B:
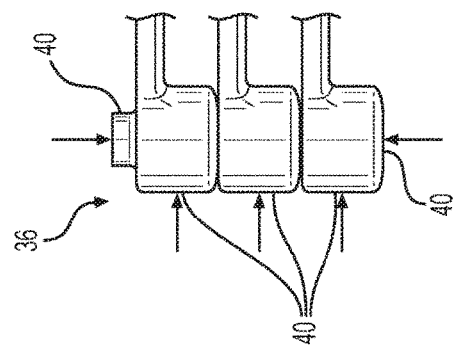
FIG. 7B is a bottom view of a portion of the cooling module row assembly of FIG. 2, showing an outlet header.

The location of the one or more inlet ports 40 and outlet ports 44 and corresponding connectors may vary. For example, FIGS. 7A and 7B show a top view of some of the potential locations where inlet ports 40 for inlet header 36 may be positioned and outlet ports 44 for outlet header 38 may be positioned with connectors. In some embodiments, the positioning of the connectors may correspond, for example, the inlet port 40 and outlet port 44 connectors may be stacked one on top of another.

In some embodiments, the position of the connectors may be readily adjustable to accommodate the variability in space constraints around IMMs 12. For example, inlet header 36 and outlet header 38 may have a plurality of inlet ports 40 and outlet ports 44 and the connectors may be moved from one inlet port 40 or outlet port 44 to another. The inlet port 40 or outlet port 44 vacated by the connector may be plugged or blanked off.

It is contemplated that the dimensions and configuration of module row 14 may vary. For example, FIG. 8A shows an exemplary embodiment of module row 14. As shown in FIG. 8A, module row may have an overall height H, a conduit height $H_C$, and an overall length L.

Overall height H may vary. For example, in some embodiments, height H may be about 15 millimeters, about 20 millimeters, about 25 millimeters, about 30 millimeters, greater than about 30 millimeters, or be within a range between any combinations of these listed heights. Similarly, conduit height $H_C$ may vary. For example, in some embodiment conduit height $H_C$ may be between about 15 millimeters and about 20 millimeters, about 20 millimeters and about 25 millimeters, and about 25 millimeters and about 30 millimeters, or greater than about 30 millimeters. It is contemplated that other dimensions, standard or otherwise, are envisioned. In some embodiments, height H and conduit $H_C$ may be equal.

In some embodiments, overall height H and/or conduit height $H_C$ can correspond with a height of IMMs 12. For example, in some embodiments overall height H and/or conduit height $H_C$ can be greater than a height IMMs so cooling module rows 14 protrudes above IMMs 12. In some embodiments, overall height H and/or conduit height $H_C$ can be about the same as the height of IMMs 12 so cooling module rows 14 may be about flush with IMMs 12. In some embodiments, overall height H and/or conduit height $H_C$ can be less than a height of the IMMs 12 so cooling module rows 14 may be recessed below IMMs 12.

The overall length L of cooling module rows 14 can vary depending on whether cooling module rows 14 are designed for one IMM 14 or two IMMs (e.g., end-to-end). FIGS. 1-6 and 8A show an embodiment of cooling module rows 14 designed for two IMMs positioned end-to-end. For a one IMM 12 application, the overall length L can range between about 100 millimeters to about 150 millimeters, about 150 millimeters to about 200 millimeters, about 200 millimeters to about 250 millimeters. For a two end-to-end IMMs 12 application, the overall length L can range between about 250 millimeters to about 300 millimeters, about 300 millimeters to about 350 millimeters, or about 350 millimeters to about 400 millimeters. It is contemplated that other dimensions, standard or otherwise, are envisioned.

As shown in FIG. 8A, a width W of conduit 26 may be uniform along length L. Width W of conduit 26 may vary, for example, in some embodiments about 2 millimeters, about 3 millimeters, about 4 millimeters, about 5 millimeters, about 6 millimeters, about 7 millimeters, about 8 millimeters, greater than about 10 millimeters, or be within a range between any combinations of these listed widths. Width W may correspond to the distance of available space between two adjacent IMMs 12.

As shown in FIG. 8A, a gap G may exist between adjacent conduits 26 of cooling module rows 14. Gap G may be adjustable during manufacturing (e.g., before brazing, welding, or gluing) based on the distance between adjacent in-line memory modules 12. Gap G may be, for example, in some embodiments about 2 millimeters, about 3 millimeters, about 4 millimeters, about 5 millimeters, about 6 millimeters, about 8 millimeters, about 10 millimeters, greater than about 10 millimeters, or be within a range between any combinations of these listed distances.

In some embodiments, a width of conduit 26 along length L may vary. For example, FIG. 8B shows another exemplary embodiment of a cooling module row 14' and corresponding cooling module row assembly 20'. Cooling module row 14' may have also the same features and dimensions as described herein with regard to cooling module row 14, except cooling module row 14' may include one or more recessed sections 46 along a conduit 26'. Recessed section 46 may have a recessed width $W_R$ that is less than width W of conduit 26'. Recessed sections 46 may be configured so that the recess is only on one side of conduit 26' or in some embodiments it may be on both sides of conduit 26'. The recessed width $W_R$ may be sized to accommodate a securing mechanism of in-line memory sockets 18, which may be positioned between IMMs 12 and inlet chamber 22 and outlet chamber 24, as shown in FIG. 1. In other words, recessed sections 46 may define recesses configured to accommodate the securing mechanism for the in-line memory sockets 18.

In some embodiments, as shown in FIG. 8B, conduits 26' may include multiple recessed sections 46. Embodiments of conduit 26' having multiple recessed sections 46 may be particularly suitable for applications where two IMMs 12 are positioned end-to-end, as shown in FIG. 1. Thus, the multiple recessed sections 46 may define a first recessed section for accommodating the portion of the in-line memory socket 18 at one end of one of IMM 12 and the second recessed section may accommodate the portion of the in-line memory sockets 18 in between the end-to-end IMMs 12.

Width W of conduit 26' and recessed width $W_R$ may vary. For example, in some embodiments width W may be about 2 millimeters, about 3 millimeters, about 4 millimeters, about 5 millimeters, about 6 millimeters, about 7 millimeters, about 8 millimeters, greater than about 10 millimeters, or be within a range between any combinations of these listed widths. Width W may correspond to the distance of available space between two adjacent IMMs 12. In some embodiments, recessed width $W_R$ may be about 1 millimeter, about 2 millimeters, about 3 millimeters, about 4 millimeters, or about 5 millimeters, or be within a range between any combinations of these listed widths. It is contemplated that other dimensions, standard or otherwise, are envisioned.

For the purposes of this description, all references to cooling module row 14, cooling module row assembly 20, and conduit 26 are all equally applicable to cooling module row 14', cooling module row assembly 20', and conduit 26' besides where a distinction is noted.

The cross-sectional shape of conduit 26 may be one of numerous suitable shapes. For example, the cross-sectional shape of conduit 26 may be circular, rectangular, square, oval, or the like. The cross-sectional shape of conduit 26 may be configured to maximize the available space between two adjacent IMMs modules 12. FIG. 9A shows a cross-section of conduit 26 and FIG. 9B shows a cross-section of conduit 26' at a recessed section 46. FIG. 9A also illustrates a cross-section of conduit 26' at a portion which is not recessed. As shown in FIGS. 9A and 9B, the cross-section of conduit 26, 26' can be generally rectangular and the cross-section of each half of conduit 26, 26' can also be generally rectangular.

Like the overall dimensions of each cooling module row 14, the cross-sectional dimensions of conduit 26, 26' may also vary. The cross-sectional area A of each half of conduit 26, 26' can vary based on the dimensions. As shown comparatively by FIGS. 9A and 9B, a cross-sectional area $A_R$ at recessed section 46 (see FIG. 9B) is less than the cross-sectional area A of conduit 26 or conduit 26' at the non-recessed sections (see FIG. 9A). In some embodiments, the cross-sectional area $A_R$ of recessed section 46 may be between, for example, about 10 mm$^2$ to about 15 mm$^2$, about 15 mm$^2$ to about 20 mm$^2$, about 20 mm$^2$ to about 25 mm$^2$, or about 25 mm$^2$ to about 30 mm$^2$. In some embodiments, the cross-sectional area A may be between, for example, about 20 mm$^2$ to about 25 mm$^2$, about 25 mm$^2$ to about 30 mm$^2$, about 30 mm$^2$ to about 35 mm$^2$, or about 35 mm$^2$ to about 40 mm$^2$.

Figure 10:
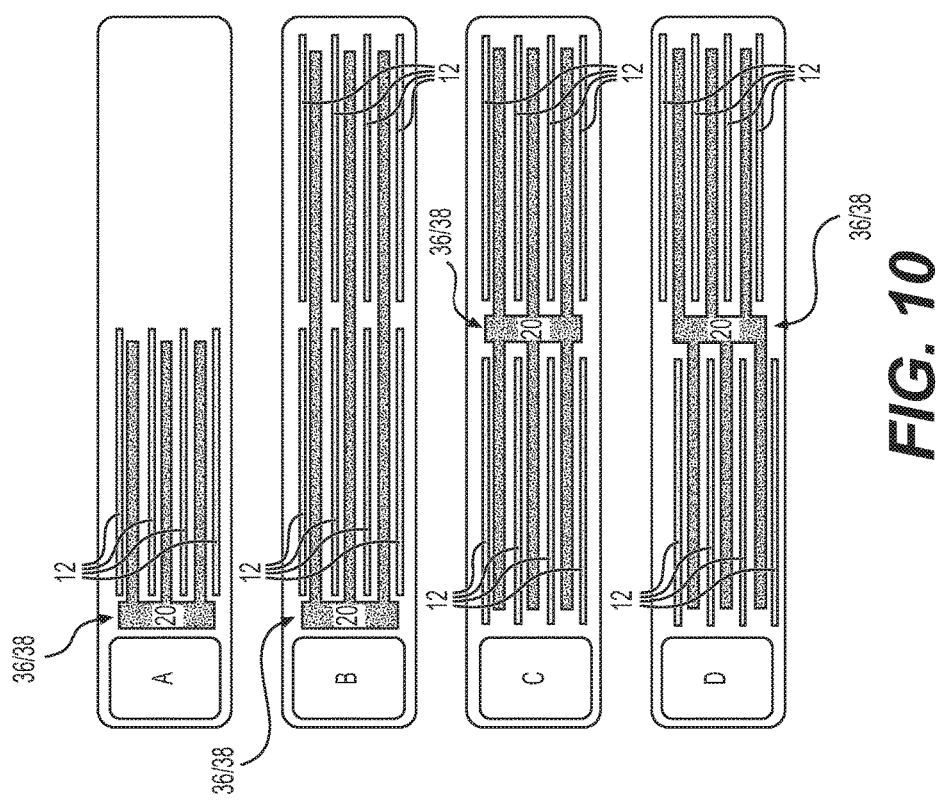
FIG. 10 is a schematic illustration of configurations A-D for cooling module row assemblies, according to exemplary embodiments.

The modularity of cooling module rows 14 can enable a variety of different configurations for cooling module row assemblies 20 that may be specifically selected based on the layout and space constraints of a computer server 10. For example, as shown in FIG. 10, configuration A illustrates an embodiment of cooling module row assembly 20 comprising three cooling module rows 14 that are positioned in between four IMMs 12. In some embodiments, configuration A may be flipped around so inlet header 36 and outlet header 38 are positioned at the other end of the four IMMs 12.

Configuration B shown in FIG. 10 illustrates another embodiment of cooling module row assembly 20 similar to configuration A, except that length L of the cooling modules rows 14 is longer so the length L corresponds with the length of two end-to-end IMMs 12. Similar to configuration A, in some embodiments, configuration B could be flipped around so inlet header 36 and outlet header 38 are positioned at the other end of the four IMMs 12.

Configuration C shown in FIG. 10 illustrates a middle out configuration where inlet and outlet headers 36, 38 are positioned in between pairs of end-to-end IMMs 12. In some embodiments configuration C may be formed of a single module row assembly 20 where a single inlet header 36 and a single outlet header 38 may connect with conduits 26 extending out in both directions along the end-to-end IMMs 12. In some embodiments, configuration C may be formed of two separate module row assemblies 20 where the left set of coolant memory module rows 14 have a common inlet header 36 and outlet header 38 and the right set of coolant memory module rows 14 has a common inlet header 36 and outlet header 38.

Configuration D shown in FIG. 10 illustrates another middle out configuration where the end-to-end IMMs 12 are not aligned, but instead are offset. Like configuration C, configuration D may be formed of a single module row assembly 20 where a single inlet header 36 and a single outlet header 38 may connect with conduits 26 that are offset and extend out in both directions along the offset end-to-end IMMs 12. In some embodiments, configuration D may be formed of two separate module row assemblies 20 where the left set of memory module rows has a common inlet header 36 and outlet header 38 and the right set of memory module rows has a common inlet header 36 and outlet header 38.

The location of inlet headers 36 and outlet header 38 of the various configurations (e.g., A-D) may be selected based on a variety of factors. For example, in some embodiments the location may be selected based on availability of space, distance to the other thermal management system components (e.g., select to minimize tubing distances), ease of assembly, location of other heat generating components). Regardless of the configuration inlet headers 36 and outlet headers 38 may be positioned on a single end of an IMM 12.

In some embodiments, the various configurations (e.g., A-D) can be modified to include one or two additional cooling module rows 14 so that the one or both of the outside IMMs 12 are straddled on both sides by cooling module rows 14.

Configurations A-D are just four examples of the numerous configurations that may be implemented based on the teaching in the present disclosure. Furthermore, although configurations A-D correspond to applications of either four individual IMMs 12 or four sets of end-to-end IMMs 12 it should be understood that the configurations may be adjusted (i.e., increased or decreased) in terms of the number of cooling module rows 14 based on the number of IMMs 12.

Figure 11:
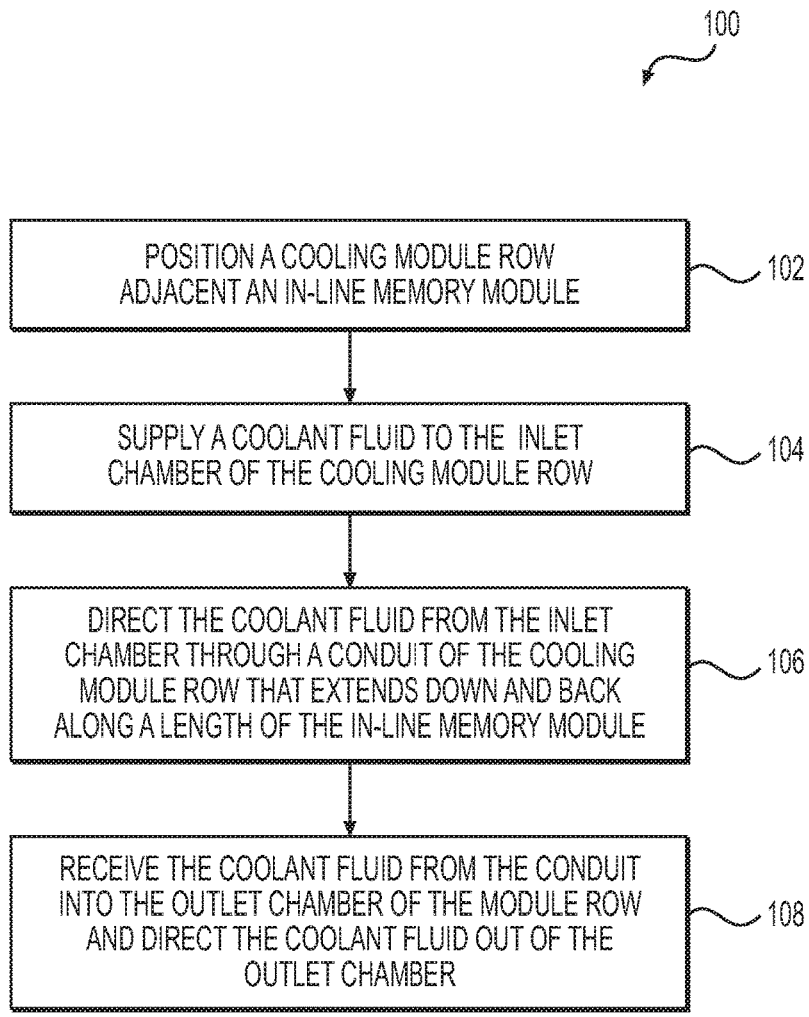
FIG. 11 is a flow chart illustrating a method of heat management for an in-line memory module.

Cooling module rows 14 and cooling module row assemblies 20 described herein may be utilized for a variety of methods of heat management for IMMs 12. Various methods of heat management utilizing cooling module rows 14 and cooling module row assemblies 20 will now be described with reference to FIG. 11.

One or more cooling module rows 14 may be utilized for a method 100 of heat management for one or more IMMs 12. In some embodiments, method 100 at step 102 may begin by positioning at least one cooling module row 14 adjacent at least one IMM 12. As described herein, cooling module row 14 may have an inlet chamber 22, outlet chamber 24, and conduit 26 connecting the two chambers. Further as described herein, inlet chamber 26 and outlet chamber 28 may be positioned at the same end of cooling module row 14 and the same end of IMM 12. Method 100 may also optionally include positioning and installing additional components (e.g., tubing, pumps, heat exchangers, cold plates, hotplates, etc.) of the heat management system. Method 100 may also optionally include determining the configuration or positioning of cooling module row 14 or cooling module row assembly 20. As described herein, the configuration or positioning may be determined based on a variety of factors, including for example, availability of space, distance to the other thermal management system components (e.g., select to minimize tubing distances), ease of assembly, location of other heat generating components).

For step 104, method 100 may include supplying coolant fluid 28 to inlet chamber 26 of cooling module row 14. As described herein, coolant fluid 28 may be supplied to inlet chamber 26 or an inlet header 36 for a cooling module assembly 20. For step 106, method 100 may include directing coolant fluid 28 from inlet chamber 22 through conduit 26 of cooling module row 14 down and back along a length of IMM 12. For step 108, method 100 may include receiving coolant fluid 28 from conduit 26 into outlet chamber 24 and directing coolant fluid 28 out of outlet chamber 24.

The foregoing description has been presented for purposes of illustration. It is not exhaustive and is not limited to precise forms or embodiments disclosed. Modifications and adaptations of the embodiments will be apparent from consideration of the specification and practice of the disclosed embodiments. For example, the described embodiments of module row and module row assemblies may be adapted for used with a variety of in-line memory module configuration and arrangements.

Moreover, while illustrative embodiments have been described herein, the scope includes any and all embodiments having equivalent elements, modifications, omissions, combinations (e.g., of aspects across various embodiments), adaptations and/or alterations based on the present disclosure. The elements in the claims are to be interpreted broadly based on the language employed in the claims and not limited to examples described in the present specification or during the prosecution of the application, which examples are to be construed as nonexclusive. Further, the steps of the disclosed methods can be modified in any manner, including reordering steps and/or inserting or deleting steps.

The features and advantages of the disclosure are apparent from the detailed specification, and thus, it is intended that the appended claims cover all systems and methods falling within the true spirit and scope of the disclosure. As used herein, the indefinite articles "a" and "an" mean "one or more." Similarly, the use of a plural term does not necessarily denote a plurality unless it is unambiguous in the given context. Words such as "and" or "or" mean "and/or" unless specifically directed otherwise. Further, since numerous modifications and variations will readily occur from studying the present disclosure, it is not desired to limit the disclosure to the exact construction and operation illustrated and described, and accordingly, all suitable modifications and equivalents may be resorted to, falling within the scope of the disclosure.

Other embodiments will be apparent from consideration of the specification and practice of the embodiments disclosed herein. It is intended that the specification and examples be considered as example only, with a true scope and spirit of the disclosed embodiments being indicated by the following claims.

The invention claimed is:

1. A cooling module row for an inline-memory module, comprising:
    an inlet chamber and an outlet chamber positioned at a same end of the cooling module row, stacked on top of one another, and separated by a chamber boundary wall; and
    a conduit in fluid communication with the inlet chamber and the outlet chamber, the conduit has a rectangular cross-section split in half by a conduit boundary wall, wherein a first half of the conduit is configured to direct a coolant fluid away from the inlet chamber and a second half of the conduit is configured to direct the coolant fluid toward the outlet chamber;
    wherein the conduit is sized to fit adjacent the in-line memory module.

2. The cooling module row of claim 1, wherein the conduit is U-shaped such that the coolant fluid flows from the inlet chamber along the first half of the conduit parallel along at least a portion of a length of the inline-memory module, does a 180 degree turn and flows back along the second half of the conduit parallel along the first half of the conduit and into the outlet chamber.

3. The cooling module of claim 1, wherein a width of the conduit corresponds to a distance between the in-line memory module and a second in-line memory module positioned adjacent the in-line memory module.

4. The cooling module row of claim 2, wherein the conduit extends along the length of the in-line memory module and a length of another in-line memory module positioned end-to-end with the in-line memory module.

5. The cooling module row of claim 4, where the conduit includes a first recessed section and a second recessed section, the first recessed section and the second recessed section designed to accommodate securing mechanisms for the two in-line memory modules.

6. The cooling module row of claim 2, wherein the U-shaped conduit is in a vertical orientation so that the first half of the conduit is positioned above or below the second half of the conduit and a height of the first half of the conduit and the second half of the conduit corresponds to a height of the in-line memory module.

7. The cooling module row of claim 1, wherein the conduit includes a recessed section between a first end and a second end of the conduit, wherein the recessed section has a width less than the rest of the conduit, the recessed section is designed to accommodate a securing mechanism of an in-line socket for the in-line memory module.

8. The cooling module row of claim 1, wherein the chamber boundary wall and the conduit boundary wall form one continuous boundary wall.

9. The cooling module row of claim 1, wherein the cooling module row is formed of a first component and a second component that are joined along a lengthwise cross-section of the cooling module row and secured together to define the cooling module row.

10. The cooling module row of claim 1, wherein the cooling module row has a modular design that enables the inlet chamber and the outlet chamber to be joined to inlet chambers and outlet chambers of other cooling module rows to form a cooling module row assembly.

11. A cooling module row assembly for in-line memory modules, comprising:
an inlet header and an outlet header stacked on top of one another and separated by at least one chamber boundary wall, and configured to be positioned at a same end of the in-line memory modules; and
a plurality of cooling module rows that each include
a conduit in fluid communication with the inlet header and the outlet header, each conduit has a rectangular cross-section split in half by a conduit boundary wall, wherein a first half of each conduit is configured to direct a coolant fluid away from the inlet header and a second half of each conduit is configured to direct the coolant fluid toward the outlet header;
wherein the plurality of cooling module rows are sized to fit adjacent the in-line memory modules.

12. The cooling module row assembly of claim 11, two or more of the cooling module rows are fixedly coupled to the inlet header and outlet header by at least one of brazing, welding, or adhesive bonding.

13. The cooling module row assembly of claim 11, wherein two or more of the cooling module rows are releasably coupled to the inlet header and outlet header by snap fit or push fit connection sealed by one or more seals.

14. The cooling module row assembly of claim 11, wherein the inlet header has an inlet port and the outlet header has an outlet port, the inlet port and the outlet port each have a connector designed to connect to tubes that circulate the coolant fluid that transfers heat away from the in-line memory modules.

15. The cooling module row assembly of claim 11, wherein a length of the cooling module rows corresponds to a length of a single in-line memory module and a height of each conduit corresponds to a height of the in-line memory modules.

16. The cooling module row assembly of claim 11, wherein a length of the cooling module rows corresponds to a length of two in-line memory modules positioned end-to-end.

17. The cooling module row assembly of claim 11, wherein each cooling module row includes a first conduit and a second conduit, the first conduit extends in a first direction from one side of the inlet header and the outlet header and the second conduit extends in a second direction opposite the first direction.

18. The cooling module row assembly of claim 11, wherein the at least one chamber boundary wall and the conduit boundary wall of a cooling module row form one continuous boundary wall.

19. A method of heat management for an in-line memory module, the method comprising:
positioning a cooling module row adjacent the in-line memory module, the cooling module row having an inlet chamber and an outlet chamber positioned at a same end of the cooling module row stacked on top of one another and separated by a chamber boundary wall, and;
supplying a coolant fluid to the inlet chamber;
directing the coolant fluid from the inlet chamber through a conduit that extends down and back along a length of the inline-memory module so the coolant fluid can absorb heat from the in-line memory module, wherein the conduit has a rectangular cross-section split in half by a conduit boundary wall, wherein a first half of the conduit is configured to direct the coolant fluid away from the inlet chamber and a second half of the conduit is configured to direct the coolant fluid toward the outlet chamber; and
receiving the coolant fluid from the conduit in the outlet chamber and directing the coolant fluid out of the outlet chamber to discharge the heat.

20. The method of claim 19, further comprising determining the positioning of the cooling module row based on space constraints surrounding the in-line memory module.

* * * * *